US012606913B2

(12) United States Patent
Ji et al.

(10) Patent No.: US 12,606,913 B2
(45) Date of Patent: Apr. 21, 2026

(54) SUSCEPTOR MANUFACTURING METHOD AND SUSCEPTOR MANUFACTURED BY THE SAME

(71) Applicant: MiCo Ceramics Ltd., Anseong-si (KR)

(72) Inventors: Min-Ho Ji, Anseong-si (KR);
Gi-Myeong Sung, Anseong-si (KR)

(73) Assignee: MiCo Ceramics Ltd., Anseong-si (KR)

( * ) Notice: Subject to any disclaimer, the term of this patent is extended or adjusted under 35 U.S.C. 154(b) by 157 days.

(21) Appl. No.: 18/657,829

(22) Filed: May 8, 2024

(65) Prior Publication Data

US 2024/0408829 A1 Dec. 12, 2024

(30) Foreign Application Priority Data

Jun. 7, 2023 (KR) ........................ 10-2023-0073150

(51) Int. Cl.
*B29C 65/52* (2006.01)
*B29C 65/00* (2006.01)
(Continued)

(52) U.S. Cl.
CPC ........ *C23C 16/4586* (2013.01); *B29C 65/002* (2013.01); *B29C 65/52* (2013.01);
(Continued)

(58) Field of Classification Search
CPC ... B29C 65/002; B29C 65/48; B29C 65/4835; B29C 65/52; B29C 66/004; B29C 66/45; B29C 66/474; B29L 2031/34; B32B 3/266; B32B 3/30; B32B 7/12; B32B 37/12; B32B 37/1284; B32B 37/1292; B32B 2037/1253; B32B 2457/00; C23C 14/50; C23C 16/4586; H01J 37/3244; H01J 37/32715;
(Continued)

(56) References Cited

U.S. PATENT DOCUMENTS

2018/0358253 A1 12/2018 Noh et al.
2023/0290621 A1* 9/2023 Sunohara .......... H01L 21/68785

FOREIGN PATENT DOCUMENTS

JP 5449750 B2 3/2014
KR 1020180135152 A 12/2018
(Continued)

OTHER PUBLICATIONS

Notice of Patent Allowance of Korean Patent Office in Korean—Dec. 20, 2023.
Korean Patent Office, Office Action Oct. 8, 2023.

*Primary Examiner* — Michael A Tolin
(74) *Attorney, Agent, or Firm* — NKL LAW; Jae Youn Kim

(57) ABSTRACT

The present disclosure relates to a method of manufacturing a susceptor. The present disclosure may provide a method of manufacturing a susceptor in which a cap-type bushing structure or tube structure is applied to a bonding structure of a base substrate and an insulating plate, so that the bonding structure can withstand or prevent the increase in pressure inside a gas flow path during a curing process, thereby preventing clogging of a gas hole in a high-power susceptor or the like for a high aspect ratio contact (HARC) processes, and minimizing the occurrence of arcing by reducing contamination around the gas hole. In addition, the present disclosure may also provide a susceptor manufactured by the method.

7 Claims, 11 Drawing Sheets

(51) Int. Cl.

| | |
|---|---|
| *B29L 31/34* | (2006.01) |
| *B32B 3/26* | (2006.01) |
| *B32B 3/30* | (2006.01) |
| *B32B 7/12* | (2006.01) |
| *C23C 14/50* | (2006.01) |
| *C23C 16/458* | (2006.01) |
| *H01J 37/32* | (2006.01) |
| *H10P 72/00* | (2026.01) |
| *H10P 72/72* | (2026.01) |
| *H10P 72/76* | (2026.01) |

(52) U.S. Cl.
CPC ............ *B29C 66/004* (2013.01); *B29C 66/45* (2013.01); *B32B 3/266* (2013.01); *B32B 3/30* (2013.01); *B32B 7/12* (2013.01); *C23C 14/50* (2013.01); *H01J 37/32715* (2013.01); *H01J 37/32724* (2013.01); *H10P 72/0434* (2026.01); *H10P 72/722* (2026.01); *H10P 72/7624* (2026.01); *B29L 2031/34* (2013.01); *B32B 2457/00* (2013.01); *H01J 2237/2001* (2013.01); *H01J 2237/2007* (2013.01)

(58) Field of Classification Search
CPC ......... H01J 37/32724; H01J 2237/2001; H01J 2237/2007; H01L 21/67109; H01L 21/6831; H01L 21/6833; H01L 21/68714; H01L 21/68785; H10P 72/0434; H10P 72/70; H10P 72/72; H10P 72/722; H10P 72/7604; H10P 72/7624
See application file for complete search history.

(56) References Cited

FOREIGN PATENT DOCUMENTS

| | | | | | |
|---|---|---|---|---|---|
| KR | 1020200005398 | A | 1/2020 | | |
| KR | 20200133465 | A | 11/2020 | | |
| KR | 102288530 | B1 | 8/2021 | | |
| KR | 102327461 | B1 | 11/2021 | | |
| KR | 1020220069341 | A | 5/2022 | | |
| KR | 102418014 | B1 | 7/2022 | | |
| WO | WO-2023172434 | A1 * | 9/2023 | ......... | H01L 21/6833 |

* cited by examiner

SUSCEPTOR MANUFACTURING METHOD AND SUSCEPTOR MANUFACTURED BY THE SAME

CROSS-REFERENCE TO RELATED APPLICATION(S)

This application is based on and claims priority under 35 U.S.C. 119 to Korean Patent Application No. 10-2023-0073150 filed on Jun. 7, 2023, and Korean Patent Application No. 10-2024-0026434 filed on Feb. 23, 2024, in the Korean Intellectual Property Office, the disclosure of which is herein incorporated by reference in its entirety.

BACKGROUND OF THE INVENTION

1. Field of the Invention

The present disclosure relates to a susceptor, and in particular, to a susceptor manufacturing method in which a cooling gas hole is protected from a bonding agent, and a susceptor manufactured by the same.

2. Description of the Prior Art

In general, a semiconductor device or a display device is manufactured by sequentially laminating a plurality of thin film layers including a dielectric layer and a metal layer on a glass substrate, a flexible substrate, or a semiconductor wafer substrate and then patterning the thin film layers. These thin film layers are sequentially deposited on the substrate through a chemical vapor deposition (CVD) process or a physical vapor deposition (PVD) process. The CVD process includes a low-pressure chemical vapor deposition (LPCVD) process, a plasma-enhanced CVD (PECVD) process, a metal organic CVD (MOCVD) process, and the like.

In CVD and PVD apparatuses, susceptors are placed to support glass substrates, flexible substrates, semiconductor wafer substrates, or the like and to execute semiconductor processes. The susceptors may each include a chuck electrode installed in a CVD device or a PVD device to support a substrate, and a heating line configured to heat the substrate in a heat treatment process or the like. In addition, the susceptors may each include a radio frequency (RF) electrode instead of the heating wire or may further include a radio frequency (RF) electrode to be also used to form plasma in an etching process of thin film layers formed on a substrate.

In the susceptor described above, a base substrate and an insulating plate bonded thereto has a certain cooling structure in order to uniformly cool the substrate on the insulating plate by using an external cooling gas. In general, the cooling structure is provided such that a cooling gas flow path provided in the base substrate communicates with gas holes provided in the insulating plate. In the process of bonding the base substrate and the insulating plate with a liquid bonding agent, various attempts are being made to prevent the bonding agent from penetrating into the gas holes.

FIG. 1 is a view illustrating a method of bonding a base substrate 20 and an insulating plate 13 of a conventional susceptor.

Referring to FIG. 1, in the conventional susceptor manufacturing process, while the base substrate 20 having a gas flow path 21 and the insulating plate 13 having a gas hole 3 are being bonded with a liquid bonding agent 12, an insulating bushing 40 is inserted into an end of the gas flow path 21 to prevent the liquid bonding agent 12 from penetrating into the gas flow path 21, a bonding process is performed after covering an adhesive film 50 on the insulating pushing, and subsequently, an appropriate process is added to allow the gas flow path to communicate with the gas hole 3.

However, when bonding the base substrate 20 and the insulating plate 13 after applying the adhesive film 50, thermal curing proceeds, and at this time, the adhesive film 50 is lifted due to thermal expansion, which makes it impossible to completely prevent the bonding agent 12 from penetrating into the gas flow path 21. Accordingly, in this structure, contamination or the like around the gas hole may cause gas supply failure, particle generation, arcing, or the like. In particular, this problem is serious in a high-power susceptor or the like for a high-aspect ratio contact (HARC) process.

SUMMARY OF THE INVENTION

Therefore, the present disclosure was made to solve the above-mentioned problems, and is to provide a method of manufacturing a susceptor, in which a cap-type bushing structure or tube structure is applied to a bonding structure of a base substrate and an insulating plate so that the bonding structure can withstand or prevent the increase in pressure inside a gas flow path during a curing process, thereby preventing clogging of a gas hole in a high-power susceptor or the like for a high aspect ratio contact (HARC) process, and minimizing the occurrence of arcing by reducing contamination around the gas hole. Furthermore, the present disclosure is to provide a susceptor manufactured by the method.

First, to summarize the features of the present disclosure, a method of manufacturing a susceptor according to an aspect of the present disclosure may include the steps of: inserting a cap-type bushing structure into a groove formed at an end of a gas flow path extending into a gas hole in an insulating plate; forming a bonding layer around the cap-type bushing structure by using a bonding agent; placing a base substrate on the bonding layer such that an end of a gas flow path in the base substrate meets the cap-type bushing structure and bonding the base structure to the insulating plate; and processing the cap-type bushing structure on a lower side of the gas flow path in the base substrate to form a through hole in the cap-type bushing structure.

In addition, a method of manufacturing a susceptor according to another aspect of the present disclosure may include the steps of: inserting a tube structure into a groove formed at an end of a gas flow path extending into a gas hole in an insulating plate; forming a bonding layer by using a bonding agent to a level equal to or lower than a height of the end of the tube structure; bonding a base substrate to the bonding layer by inserting the tube structure into a gas flow path in the base substrate; and removing the tube structure.

In the step of inserting the tube structure, a bushing structure having a through hole may be first inserted into the groove, and then the tube structure may be inserted into the inside of the bushing structure.

The bushing structure may be made of ceramic which is the same material as the insulating plate.

The bushing structure may have a height that extends to a level equal to or higher than the end of the groove in the insulating plate.

The tube structure may be made of a plastic material.

Preferably, the tube structure has a diameter that is equal to or less than that of the groove formed at the end of the gas flow path extending into the gas hole in the insulating plate.

Preferably, the tube structure has a diameter that is equal to or less than that of the through hole in the bushing structure.

In addition, a susceptor according to another aspect of the present disclosure may include: a base substrate having a gas flow path configured to supply a cooling gas; an insulating plate fixed on the base substrate and having a gas hole; and a bushing structure having a through hole configured to allow the gas flow path and the gas hole to communicate with each other between the base substrate and the insulating plate. The bushing structure may include a screw tap formed on an inner wall of the through hole.

The screw tap may be used for tap fastening with a tube structure to prevent penetration of a bonding agent during a manufacturing process.

According to a method of manufacturing a susceptor of the present disclosure and a susceptor manufactured by the method, by applying the cap-type bushing structure or tube structure to the bonding structure of the base substrate and the insulating plate, the bonding structure can withstand or prevent the increase in pressure inside a gas flow path during a curing process, thereby preventing clogging of a gas hole in a high-power susceptor or the like for a high aspect ratio contact (HARC) process, and minimizing the occurrence of arcing by reducing contamination around the gas hole.

BRIEF DESCRIPTION OF THE DRAWINGS

The accompanying drawings, which are included as a part of a detailed description to help the understanding of the present disclosure, provide embodiments of the present disclosure, and illustrate the technical spirit of the present disclosure together with the detailed description, in which.

DETAILED DESCRIPTION OF THE EXEMPLARY EMBODIMENTS

Figure 1:
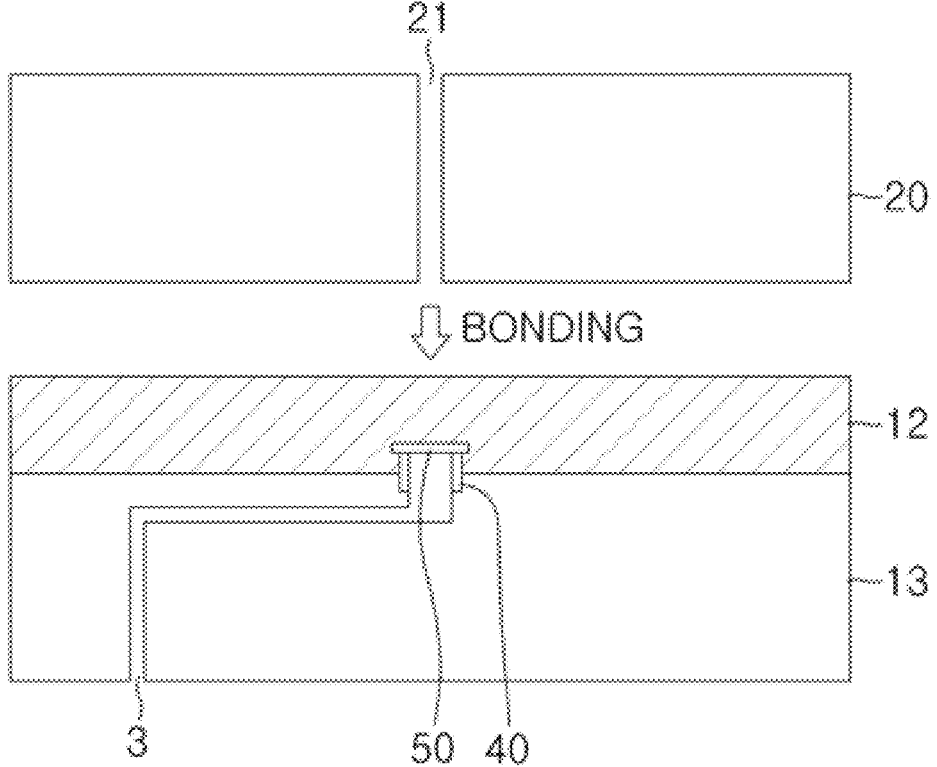
FIG. 1 is a view illustrating a method of bonding a base substrate 20 and an insulating plate 13 of a conventional susceptor.

Hereinafter, the present disclosure will be described in detail with reference to the accompanying drawings. Herein, like components in each drawing are denoted by like reference numerals if possible. In addition, detailed descriptions of already known functions and/or configurations will be omitted. In the following description, components necessary for understanding operations according to various embodiments will be mainly described, and descriptions of elements that may obscure the gist of the description will be omitted. In addition, some elements in the drawings may be exaggerated, omitted, or schematically illustrated. The size of each component does not entirely reflect the actual size, and therefore, the descriptions provided herein are not limited by the relative sizes or spacings of the components drawn in each drawing.

In describing the embodiments of the present disclosure, when a detailed description of the known technology related to the present disclosure is determined to unnecessarily obscure the subject matter of the present disclosure, the detailed description will be omitted. In addition, terms to be described later are defined in consideration of functions in the present disclosure and may vary according to the intention, custom, or the like of a user or operator. Therefore, the definitions of the terms should be made based on the description throughout this specification. Terms used in the detailed description are only for describing the embodiments of the present disclosure, and should not be treated as limiting. Unless expressly used otherwise, singular forms of expressions include the meanings of plural forms of expressions. In this description, expressions such as "including" or "comprising" are intended to indicate any features, numbers, steps, operations, elements, or some or combinations thereof, and should not be construed to exclude the existence or possibility of one or more other features, numbers, steps, operations, elements, or some or combinations thereof, in addition to those described above.

In addition, terms such as "first" and "second" may be used to describe various components, but the components are not limited by the terms, and these terms are only used for the purpose of distinguishing one component from another.

First, in the present disclosure, the susceptor is a semiconductor apparatus used for processing processing-target substrates for various purposes such as a semiconductor wafer, a glass substrate, and a flexible substrate, in which the susceptor may include an electrostatic chuck electrode to be used as an electrostatic chuck to support a processing-target substrate, or the susceptor may include a heating wire (or heating element) for a heater to heat a processing-target substrate to a predetermined temperature. Alternatively, the susceptor may further include a radio frequency electrode or may include a radio frequency electrode instead of the heating wire to process a processing-target substrate in a process, such as plasma enhanced chemical vapor deposition.

Therefore, as described below, the susceptor of the present disclosure is a structure in which a base substrate including a gas flow path and an insulating plate including an electrode layer are bonded. The electrode layer provided on the insulating plate is to be understood as including conductors to implement the functions of one or more of the above-mentioned electrostatic chuck electrode, radio frequency electrode, and heating line (or a heating element).

Figure 2:
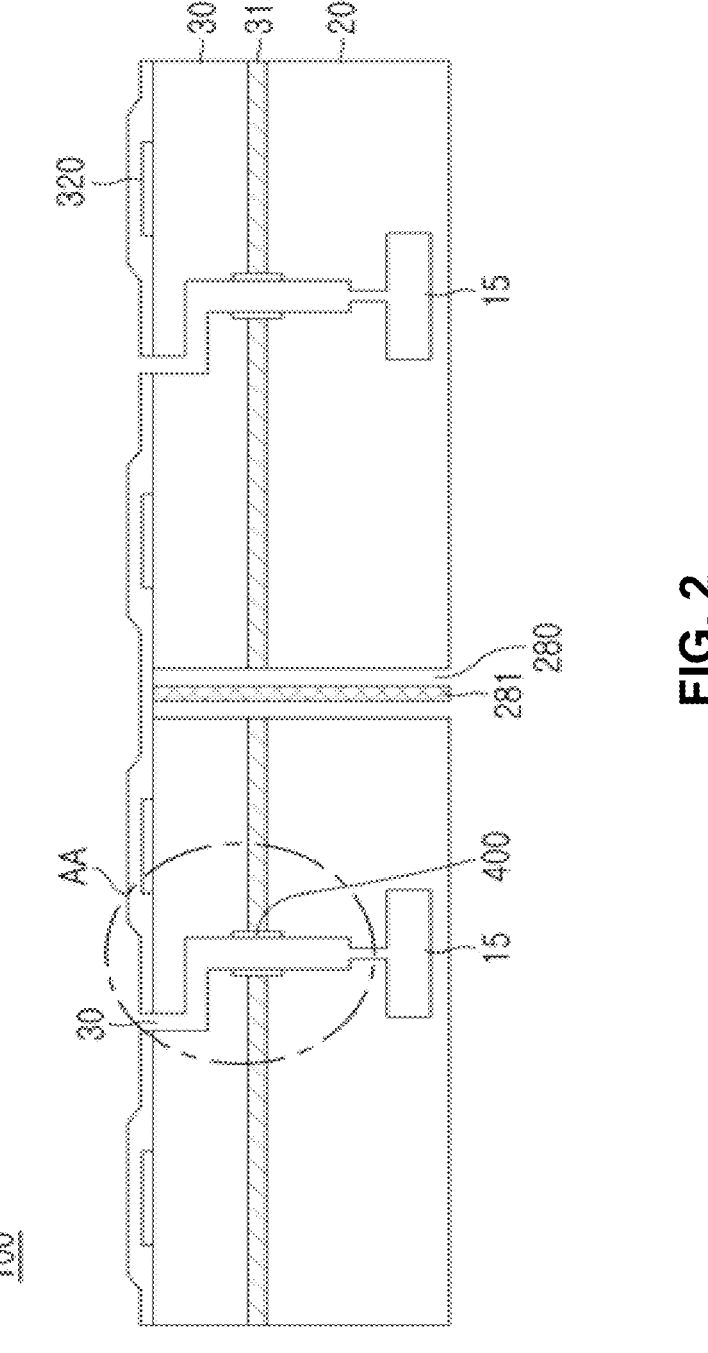
FIG. 2 is a schematic cross-sectional view of a susceptor according to an embodiment of the present disclosure.

FIG. 2 is a schematic cross-sectional view of a susceptor 100 according to an embodiment of the present disclosure.

Referring to FIG. 2, the susceptor 100 according to an embodiment of the present disclosure includes a base substrate 200 and an insulating plate 300 which are bonded with a bonding agent 312. The susceptor 100 is preferably of a circular type, but in some cases, may be designed in another shape such as oval or square.

The base substrate 200 may be configured as a multi-layer structure including a plurality of metal layers. These metal layers may be bonded through a brazing process, a welding process, a bonding process, or the like. The insulating plate 300 is fixed on the base substrate 200, and may be fixed on the base substrate 200 with certain fixing means or adhesive/ bonding means. The base substrate 200 and the insulating plate 300 may be manufactured separately and bonded, and in some cases, it is possible to provide the structure of the insulating plate 300 directly on the top surface of the base substrate 200 by using a ceramic sheet or the like.

As illustrated in FIG. 2, the insulating plate 300 includes an electrode layer 320 disposed between ceramic sheets or ceramic materials made of powder. In an embodiment, the ceramic materials may be made of a material selected from among materials such as aluminum oxide ($Al_2O_3$), aluminum nitride (AlN), silicon carbide (SiC), silicon nitride ($Si_3N_4$), silicon oxide ($SiO_2$), barium oxide (BaO), zinc oxide (ZnO), cobalt oxide (CoO), tin oxide ($SnO_2$), zirconium oxide ($ZrO_2$), $Y_2O_3$, YAG, YAM, and YAP. The insulating plate 300 may be formed on the top surface of the base substrate 200 by using the above-mentioned ceramic materials by performing a thermal spray coating process, a ceramic sheet bonding process, or the like.

The electrode layer 320 may be made of a conductive metal material. As an example, the electrode layer 320 may be made of at least one of silver (Ag), gold (Au), nickel (Ni), tungsten (W), molybdenum (Mo), and titanium (Ti), and may be more preferably made of tungsten (W). The electrode layer 320 may be formed through a thermal spray coating process or a screen printing process. The electrode layer 320 has a thickness of about 1.0 μm to 100 μm. For example, preferably, when forming the electrode layer 320 through the screen printing process, a thickness of 1.0 to 30 μm may be applied, and when forming the electrode layer 320 through the thermal spray coating process, a thickness of 30 to 100 μm may be applied. However, an excessively thin electrode layer 320 (e.g., less than 1.0 μm) is difficult to form and is therefore undesirable. This case is also undesirable because the resistance value increases due to porosity and other defects in the electrode layer, and an electrostatic adsorption force may decrease with the increase of the resistance value. In addition, when an excessively thick electrode layer 320 (e.g., exceeding 100 μm), arcing may occur, which is not desirable. Therefore, it is desirable to apply the electrode layer 320 to have an appropriate thickness in the range of about 1.0 μm to 100 μm. The electrode layer 320 formed in this way may be an electrostatic chuck that is capable of receiving a bias to generate an electrostatic force when loading a substrate (not illustrated) to be placed on the dielectric layer 330, thereby chucking the substrate, and that is capable of applying an opposite bias to the electrode layer 320 to cause discharge when unloading a substrate (not illustrated), thereby dechucking the substrate.

However, the electrode layer 320 is not limited thereto, and in some cases, the electrode layer 320 may further include electrode patterns for a heater or radio frequency electrode patterns for plasma generation. That is, the susceptor 100 of the present disclosure is a semiconductor apparatus used for processing processing-target substrates for various purposes, such as a semiconductor wafer, a glass substrate, and flexible substrate, in which the susceptor may include an electrostatic chuck electrode on the electrode layer 320 to be used as an electrostatic chuck to support a processing-target substrate, or the susceptor may include a heating wire (or heating element) to heat a processing-target substrate to a predetermined temperature. Alternatively, the susceptor may further include a radio frequency electrode or may include a radio frequency electrode instead of the heating wire to process a processing-target substrate in a process, such as plasma enhanced chemical vapor deposition.

Figure 3:
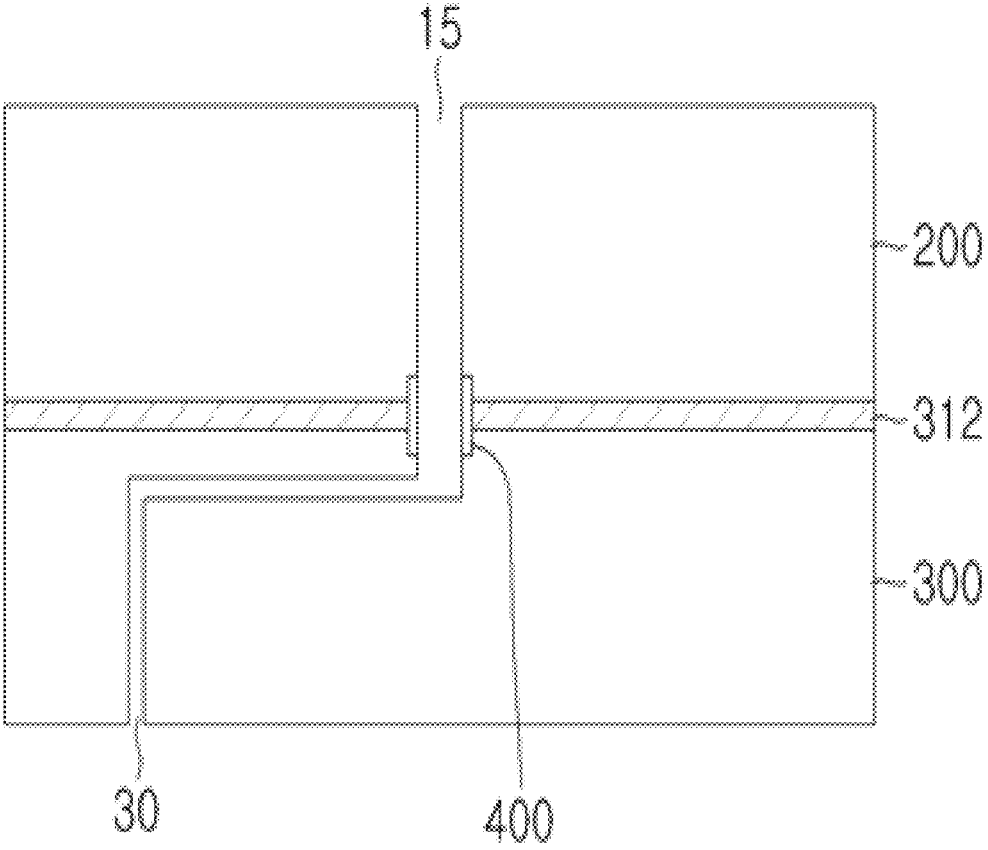
FIG. 3 is an enlarged cross-sectional view of portion AA of FIG. 2.

When the susceptor 100 is mounted inside a chamber for a semiconductor process, in order to uniformly cool the substrate on the insulating plate 300 (e.g., a glass substrate, a flexible substrate, or a semiconductor wafer substrate) by using an external cooling gas, the base substrate 200 and the insulating plate 300 may include a certain cooling structure around the gas hole 30, as illustrated in FIG. 3.

FIG. 3 is an enlarged cross-sectional view of portion AA of FIG. 2, in which the upper and lower positions are illustrated in reverse. Here, the upper and lower positions are illustrated in reverse in accordance with the process of placing and bonding the base substrate 200 on the insulating plate 300 as will be described below.

Referring to FIG. 3, for example, the base substrate 200 has a cooling gas flow path 15 in an appropriate pattern as illustrated in FIG. 2 to supply a cooling gas. A through hole of the cooling gas flow path 15 is in fluid communication with a cooling gas hole 30 in the insulating plate 300 through a bushing structure 400 configured to prevent penetration of the bonding agent 312 (see 410 in FIG. 4C or 420 in FIG. 5C) during the manufacturing process of the present disclosure, so that the cooling gas is ejected from the cooling gas hole 30 to uniformly cool a substrate on the insulating plate 300. Helium gas (He) may be mainly used as the cooling gas at this time, but is not necessarily limited thereto, and various appropriate gases may be used. The insulating plate 300 may be provided an appropriate number of cooling gas holes 30 depending on the design.

In FIG. 2, for example, for chucking and dechucking, or for heating or providing radio frequency waves, a bias is applied to the electrode layer 320 from a certain electrode rod 281 provided through a hole 280 in the lower portion of the susceptor 100. An appropriate number of cooling gas holes 30 may be provided between certain electrode patterns forming the electrode layer 320 depending on the design, and may be formed such that fluid communication from the cooling gas flow path 15 to the top surface of the insulating plate 300 is achieved through the bushing structure 400.

FIGS. 4A to 4D are cross-sectional views illustrating a gas hole portion in the process of manufacturing a respective susceptor 100 according to an embodiment of the present disclosure.

Figure 4A:
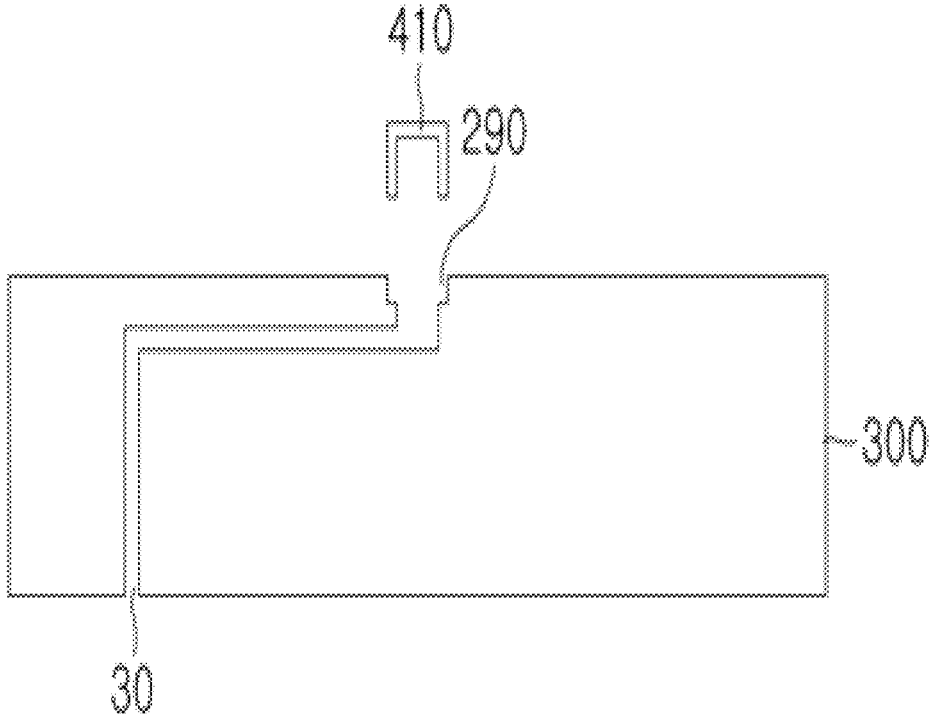
FIGS. 4A, 4B, 4C and 4D are cross-sectional views illustrating a gas hole portion in the process of manufacturing a susceptor according to an embodiment of the present disclosure.

Referring to FIG. 4A, in an embodiment of the present disclosure, in order to manufacture the susceptor 100 having a cooling gas hole 30, first, an insulating plate 300, in which a groove 290 is formed in advance at an ends of a gas flow path 15 extending to the gas hole 30 in the insulating plate 300 to supply a cooling gas, is prepared. At this time, the gas hole 30 and the gas flow path extending from the gas hole 30 to the groove 290 are preferably machined in advance in the insulating plate 300 at necessary positions. The gas hole 30 and the gas flow path may be machined through laser machining by a machining center (MCT), in which the gas hole may be machined to have a diameter of 1 mm or less or several mm or less.

A process of manufacturing the susceptor 100 may be performed on a certain workbench, but the description of the same is omitted. In order to prevent contamination of the gas hole 30 when the insulating plate 300 is placed on the workbench, it is desirable to make the lower side of the insulating plate 300 in the drawing protected with an adhesive film.

A cap-type bushing structure 410, which, with reference to the drawing, is closed at the top and opened toward the gas hole 30 at the bottom, is inserted is into the grooves 290 of the insulating plate 300. The cap-type bushing structure 410 is preferably manufactured to have a height equal to or higher than that of the end of the groove 290 in the insulating plate 300 and inserted into the groove 290. The cap-type bushing structure 410 may be made of a heat-resistant and wear-resistant insulator, metal, or ceramic material, and may preferably be made of the same material as the ceramic material of the insulating plate 300 as described above.

Figure 4B:
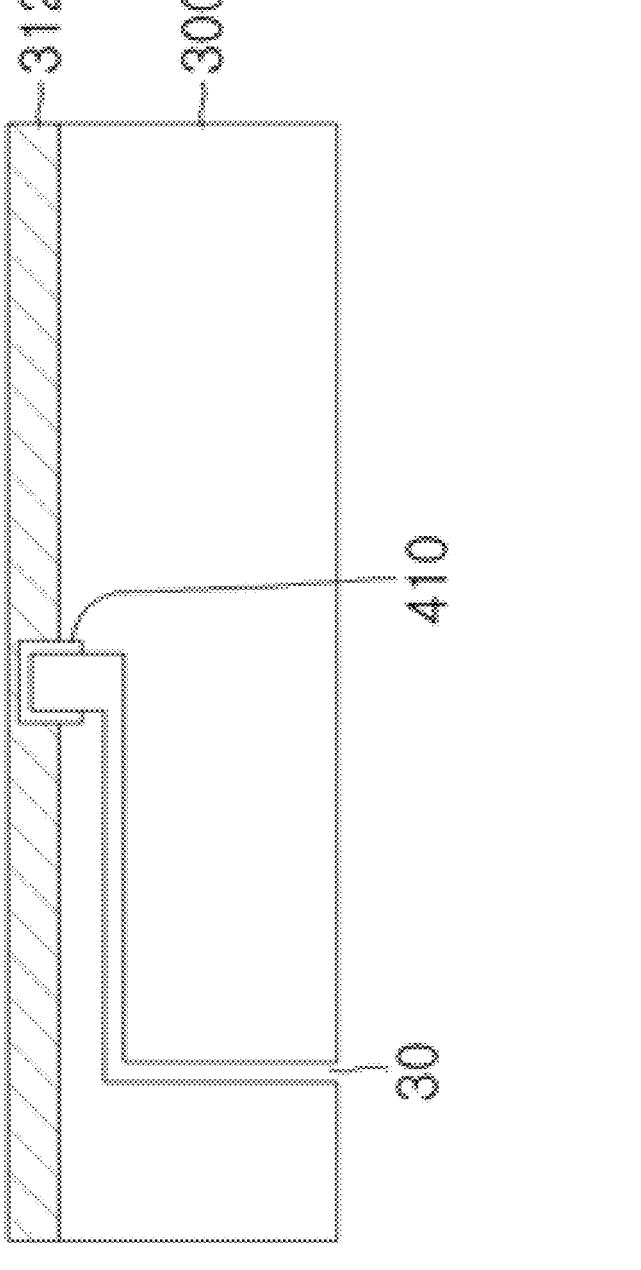

In addition, referring to FIG. 4B, after the cap-type bushing structure 410 is inserted into the groove 290 in the insulating plate 300, a bonding layer is formed around the cap-type bushing structure 410, i.e., on the side and upper portions of the same by using a liquid bonding agent 312 such as a silicone paste. At this time, when applying the bonding agent 312 on the cap-type bushing structure 410, a process of removing the bonding agent 312 may be performed such that the bonding agent 312 remains only below the height of the cap-type bushing structure 410 through a flattening process. The bonding agent 312 is preferably made of a material having a dielectric strength of 25 kV/mm or more and a volume resistance of $10^{15}$ Ωcm or more to be advantageous in preventing arcing.

Figure 4C:
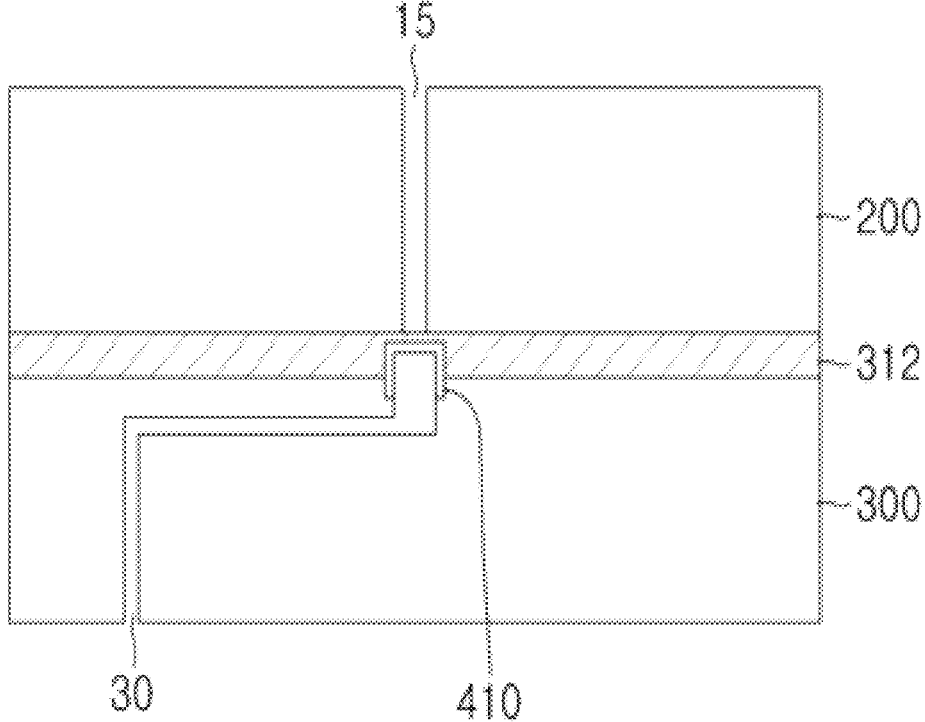

Next, referring to FIG. 4C, after the bonding layer is formed around the cap-type bushing structure 410 by using the bonding agent 312, the base substrate 200 is placed on the bonding layer made of the bonding agent 312. At this time, the base substrate 200 is placed on the bonding layer of the bonding agent 312 such that the end of the gas flow path 15 in the base substrate 200 meets the cap-type bushing structure 410 (preferably such that its center coincides with that of the cap-type bushing structure), and bonded to the insulating plate 300. When cap-type bushing structures 410 are disposed at a plurality of positions, each cap-type bushing structure 410 and each corresponding gas flow path 15 in the base substrate 200 are arranged to meet each other, and the cap-type bushing structures are bonded to the plate 300. When bonding, the base substrate 200 and the insulating plate 300 can be firmly bonded by placing the base substrate 200 as described above, and then compressing the base substrate 200 and the insulating plate 300 and thermally curing the bonding layer. At this time, by compressing, the bonding agent 312 on the cap-type bushing structure 410 may be compressed, so that the bonding agent is thinned as if it were substantially absent.

Figure 4D:
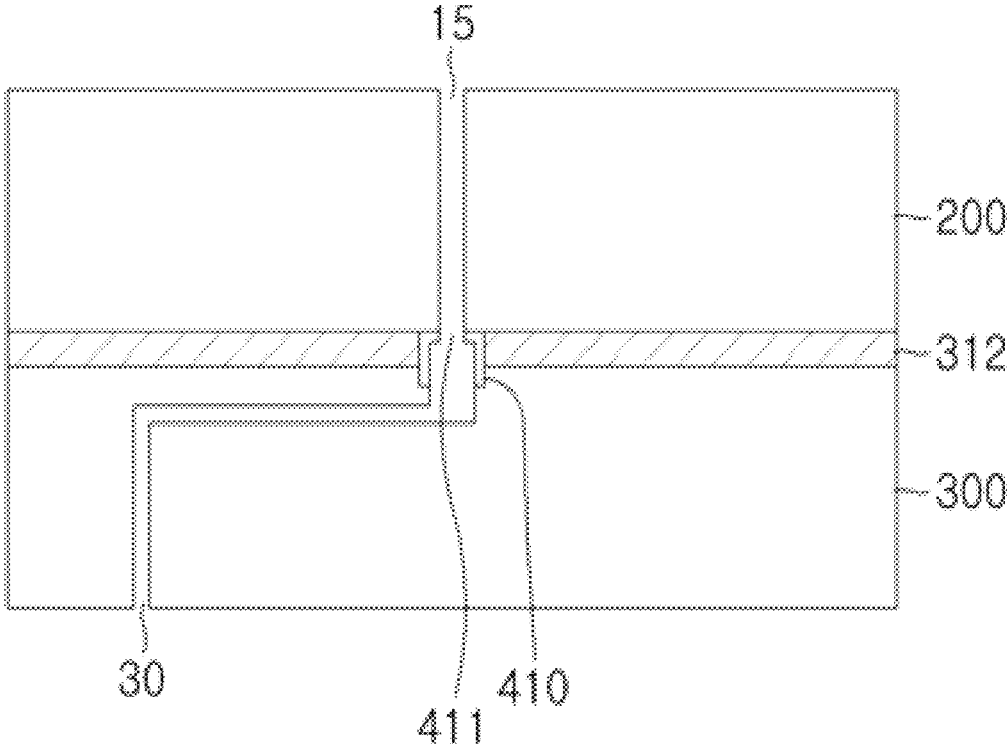

Next, referring to FIG. 4D, the type bushing structure 410 on the lower side of the gas flow path 15 of the base substrate 200 is machined to form a through hole 411. For example, the through hole 411 may be machined through laser machining by a machining center (MCT), and thus a hole with a diameter of several mm or less, or preferably a hole with a diameter of 1 mm or less, may be machined. Accordingly, fluid communication can be achieved between the gas flow path 15 in the base substrate 200 and the gas hole 30 in the insulating plate 300.

In the present disclosure, by machining and applying the through hole 411 in the cap-type bushing structure 410 after bonding the base substrate 200 on the cap-type bushing structure 410, the bonding agent 312 is prevented from flowing into the gas flow path 15 even in the compression and thermal curing process, so that fluid communication with the gas hole 30 can be prevented from being blocked. Since the cap-type bushing structure does not have a structure covered with an adhesive film 50 in the prior art, the cap-type bushing structure can sufficiently withstand an increase in pressure inside the gas flow path without being lifted, thereby preventing the gas hole 30 from clogging.

Figure 5A:
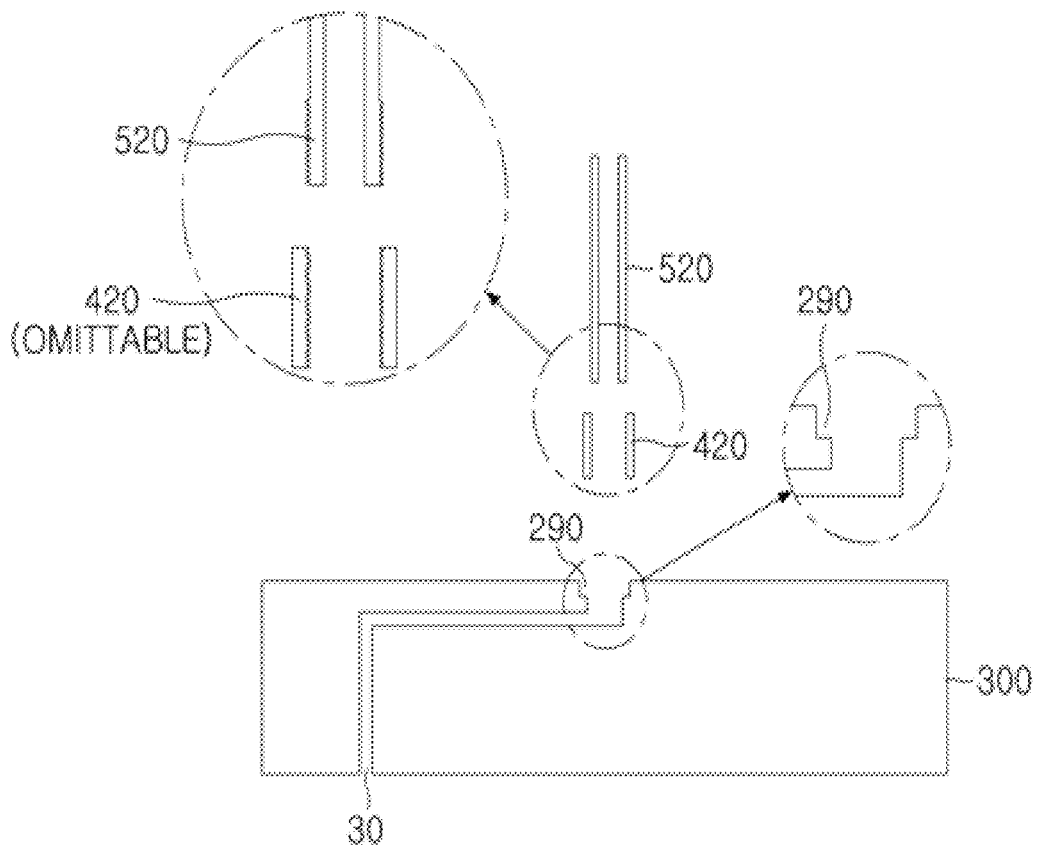
FIGS. 5A, 5B and 5C are cross-sectional views illustrating a gas hole portion in the process of manufacturing a susceptor according to another embodiment of the present disclosure.
Figure 5B:
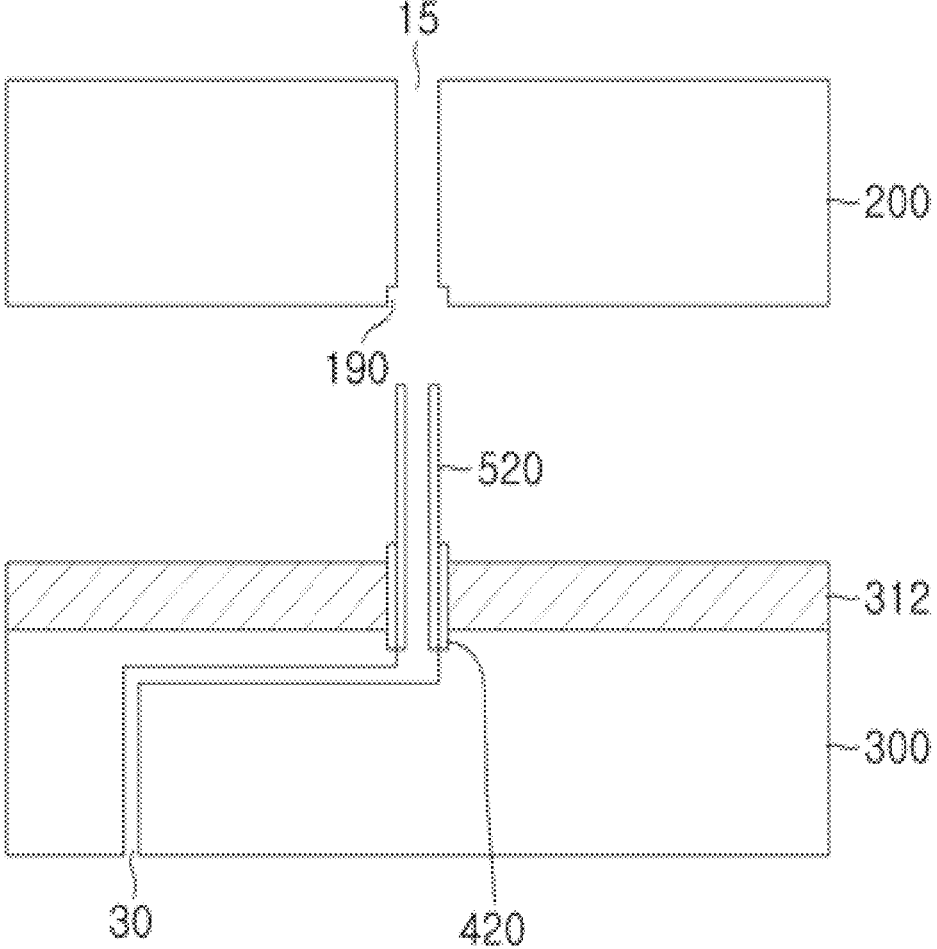
Figure 5C:
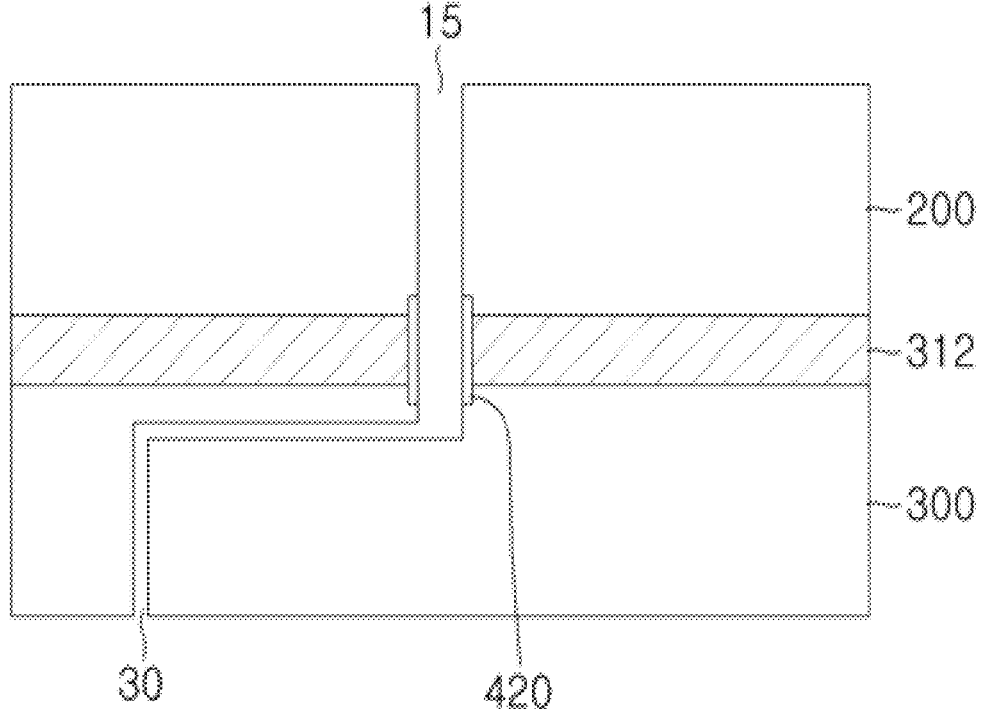

FIGS. 5A to 5C are cross-sectional views illustrating a gas hole portion in the process of manufacturing a susceptor 100 according to another embodiment of the present disclosure.

Referring to FIG. 5A, in an embodiment of the present disclosure, in order to manufacture the susceptor 100 having a cooling gas hole 30, first, an insulating plate 300, in which a groove 290 is formed in advance at an end of a gas flow path 15 extending to the gas hole 30 in the insulating plate 300 to supply a cooling gas, is prepared. At this time, the gas hole 30 extending into the groove 290 is preferably machined in advance in the insulating plate 300 at a necessary position. Such a gas hole 30 may be machined through laser machining using an MCT, and may be machined to have a diameter of 1 mm or less or several mm or less.

A process of manufacturing the susceptor 100 may also be performed on a certain workbench below, but the description of the same is omitted. In order to prevent contamination of the gas hole 30 when the insulating plate 300 is placed on the workbench, it is desirable to make the lower side of the insulating plate 300 in the drawing protected with an adhesive film.

A bushing structure 420 with a through hole opened toward the gas hole 30 on the top and bottom sides is inserted into the groove 290 of the insulating plate 300, and a tube structure 520 is further inserted into the inside of the bushing structure 420. The bushing structure 420 with the through hole is preferably manufactured to have a height equal to or higher than that of the end of the groove 290 in the insulating plate 300 and inserted into the groove 290. However, the bushing structure 420 is not absolutely necessary and may be omitted. That is, the tube structure 520 may be directly inserted into the groove 290 in the insulating plate 300.

There is no need to provide a screw tap (female thread) inside the groove 290 of the insulating plate 300, but, when necessary, a screw tap (female thread) may be provided inside the groove 290 of the insulating plate 300. For example, as in the embodiment of FIG. 6, a screw tap (female thread) formed inside the groove 290 of the insulating plate 300 may be used. At this time, the screw tap inside the groove 290 of the insulating plate 300 may be fastened to the screw tap (male screw) of the bushing structure 420 or the tube structure 520 to be inserted, in a tap fastening manner.

The bushing structure 420 may be fixed with a silicone bonding agent or the like when inserted into the groove 290 of the insulating plate 300. That is, in the case where a tube structure 520 is directly inserted into the groove 290 of the insulating plate 300 without using the bushing structure 420, when there is no screw tap formed inside the groove 290, a tube structure 520, in which a screw tap is present or absent, may be directly fixed in the groove 290 of the insulating plate 300 by using a silicone bonding agent or the like. Alternatively, when a screw tap is formed inside the groove 290, the screw tap formed inside the groove 290 and the screw tap (male thread) of the tube structure 520 may be tap-fastened.

In addition, in the case where a bushing structure 420 is used, when no screw tap is formed inside the groove 290, a bushing structure 420, in which a screw tap (male thread) is present or absent, may be fixed inside the groove 290 of the insulating plate 300 with a silicone bonding agent or the like. At this time, when a screw tap is formed inside the groove 290 (see FIG. 6), the screw tap may be tap-fastened with the screw tap (male screw) of the bushing structure 420. After inserting the bushing structure 420 into the groove 290, the tube structure 520 is further inserted into the inside (inner wall) of the bushing structure 420. At this time, the bushing structure 420 is preferably tap-fastened to the screw tap (male screw) of the tube structure 520 by using the screw tap (female screw) formed inside the bushing structure 420.

The tube structure 520 may be made of a flexible material. When the tube structure 520 is directly inserted into the groove 290 of the insulating plate 300, the diameter of the tube structure 520 is preferably less than or equal to that of the groove 290 of the insulating plate 300. In addition, when the bushing structure 420 is used, the diameter of the tube structure 520 is preferably less than or equal to that of the through hole of the bushing structure 420. This prevents the liquid binder 312 from penetrating between the bushing structure 420 and the tube structure 520 in the subsequent process.

In addition, the tube structure 520 is preferably manufactured to have a height equal to or higher than that of the end of the bushing structure 420 and inserted into the bushing structure 420. For example, the height of the tube structure 520 may be equal to or more than 5 times the height of the bushing structure 420. For example, when the height of the bushing structure 420 is 5 mm, the height of the tube structure 520 may be 40±10 mm. A plurality of such tube structures 520 may be prepared in advance on a certain jig by a number corresponding to the number of corresponding grooves 290, and the tube structures 520 may be inserted to correspond to the positions of the grooves by using the jig.

The bushing structure 420 may be made of a heat-resistant and wear-resistant insulator, metal, or ceramic material, and may preferably be made of the same material as the ceramic material of the insulating plate 300 as described above. The tube structure 520 may be made of a heat-resistant and flexible insulating material, and may be made of various materials, such as a flexible plastic material (e.g., engineering plastic such as ULTEM). The tube structure 520 made of the engineering plastic or the like may have heat resistance such that its shape is not deformed at 170° C. or higher, and does not undergo shape deformation at the above-mentioned thermal curing temperature (e.g., 150° C. or lower).

Also, referring to FIG. 5B, after only the tube structure 520 is inserted into the groove 290 of the insulating plate 300, or the bushing structure 420 and the tube structure 520 are inserted, a bonding layer is formed by using a liquid bonding agent 312, such as silicone paste, in a thickness lower than the height of the bushing structure 420 (when the bushing structure 420 is used) and equal to or lower than the height of the uppermost end of the tube structure 520. The bonding agent 312 is preferably made of a material having a dielectric strength of 25 kV/mm or more and a volume resistance of $10^{15}$ Ωcm or more to be advantageous in preventing arcing.

Next, the base substrate 200 is placed on the bonding layer made of the bonding agent 312, and the tube structure 520 is inserted into the gas flow path 15 of the base substrate 200 such that the upper end of the bushing structure 520 is seated in a groove 190 at the lower end of the gas flow path 15. At this time, it is desirable to design the height of the uppermost end of the tube structure 520 to be located at a position equal to or higher than the upper end surface of the base substrate 200. When the bushing structure 420 is not used in FIGS. 5A and 6, the groove 190 may not formed at the lower end of the gas flow path 15.

Figure 6:
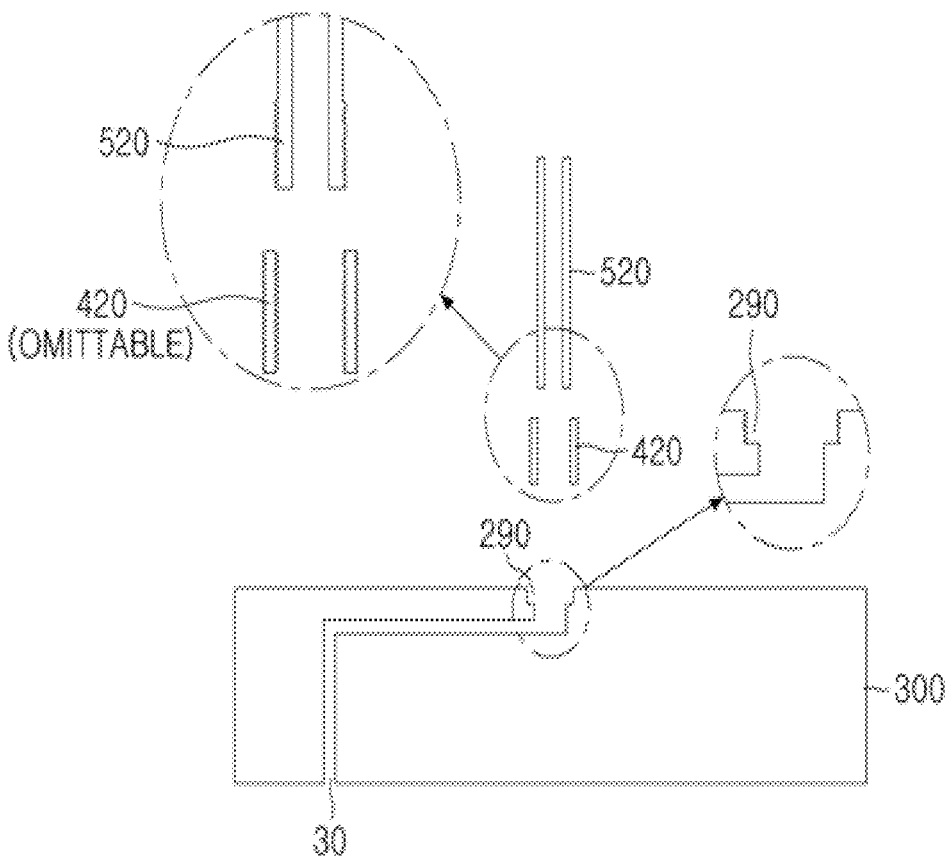
FIG. 6 is a view illustrating another embodiment of the manufacturing process of FIG. 5A.

Thereafter, referring to FIG. 5C, the base substrate 200 and the insulating plate 300 can be firmly bonded by compressing and thermally curing the base substrate 200 and the insulating plate 300. After the base substrate 200 and the insulating plate 300 are firmly bonded, the tube structure 520 is removed. The tube structure 520 may be removed by rotating the tube structure in the direction opposite to its rotating direction at the time of tap fastening with the bushing structure 420 so that the tube structure is separated from the groove 290 of the insulating plate 300 or the bushing structure 420. Referring to FIGS. 5A and 6, even when the bushing structure 420 is not used, the tube structure 520 may be removed by applying an appropriate torque to separate the tube structure 520 from the bonding agent 312.

As described above, by using the tube structure 520, or the bushing structure 420 and the tube structure 520, the bonding agent 312 can be prevented from flowing into the gas flow path 15 even during the compression and thermal curing process, so that fluid communication with the gas hole 30 can be prevented from being blocked. In addition, rather than being covered with an adhesive film as in the prior art, air passes through the tube structure 520, which is higher than the bushing structure 420, so that an increase in pressure inside the gas passage can be prevented, thereby ensuring that the-above-mentioned compression and heat curing can be performed stably.

As such, the susceptor 100 of the present disclosure, which is manufactured as illustrated in FIGS. 5A to 5C and FIG. 6, takes a form in which the insulting plate 300 is placed on the base substrate 200 when the susceptor 100 is mounted inside a chamber for a semiconductor process.

At this time, the susceptor 100 of the present disclosure may include: a base substrate 200 having a gas flow path 15 configured to supply a cooling gas; an insulating plate 300 fixed on the base substrate 200 and having a gas hole 30; and a bushing structure 420 having a through hole configured to allow the gas flow path 15 and the gas hole 30 to communicate with each other between the base substrate 200 and the insulating plate 300. As described above, it is desirable to form a screw tap on the inner wall of a through hole in the bushing structure 420. The screw tap on the inner wall of the through hole in the bushing structure 420 may be used for tap fastening with the tube structure 520 configured to prevent penetration of the bonding agent during the above-described manufacturing processes. In addition, the above-described embodiments are directly applied to, for example, forming screw taps on the outside (outer wall) of the bushing structure 420 and the inside (inner wall) of the groove 290 in the insulating plate 300 as well.

As described above, according to the method of manufacturing the susceptor 100 of the present disclosure, by applying the cap-type bushing structure 410, the tube structure 520 inserted into the bushing structure 410, or the like to the bonding structure of the base substrate 200 and the insulating plate 300, the bonding structure can withstand or prevent the increase in pressure inside a gas flow path during a curing process, thereby preventing clogging of a gas hole in a high-power susceptor or the like for a high aspect ratio contact (HARC) process, and minimizing the occurrence of arcing by reducing contamination around the gas hole.

As described above, the present disclosure has been described based on specific details, such as specific components, limited embodiments, and drawings, but these are only provided to help a more general understanding of the present disclosure, and the present disclosure is not limited to the above-described embodiments. A person ordinarily skilled in the art to which the present disclosure pertains may make various modifications and changes without departing from the essential characteristics of the present disclosure. Therefore, the spirit of the present disclosure should not be limited to the described embodiments, and not only the appended claims, but also all technical ideas that are equivalent to or equivalently modified to the claims should be interpreted as being included in the scope of the present disclosure.

What is claimed is:

1. A method of manufacturing a susceptor, the method comprising:

inserting a tube structure into a groove formed at an end of a gas flow path extending into a gas hole in an insulating plate;

forming a bonding layer by using a bonding agent to a level equal to or lower than a height of an end of the tube structure;

bonding a base substrate to the bonding layer by inserting the tube structure into a gas flow path in the base substrate; and removing the tube structure.

2. The method of claim 1, wherein, in the inserting of the tube structure, a bushing structure having a through hole is first inserted into the groove, and then the tube structure is inserted inside the bushing structure.

3. The method of claim 2, wherein the bushing structure is made of ceramic which is a same material as the insulating plate.

4. The method of claim 2, wherein the bushing structure has a height that extends to a level equal to or higher than an end of the groove in the insulating plate.

5. The method of claim 1, wherein the tube structure is made of a plastic material.

6. The method of claim 1, wherein the tube structure has a diameter that is equal to or less than a diameter of the groove formed at the end of the gas flow path extending into the gas hole in the insulating plate.

7. The method of claim 2, wherein the tube structure has a diameter that is equal to or less than a diameter of the through hole in the bushing structure.

* * * * *